US012641996B2

(12) United States Patent
Feng et al.

(10) Patent No.: US 12,641,996 B2
(45) Date of Patent: May 26, 2026

(54) QUANTUM DOT FILM LAYERS, QUANTUM DOT LIGHT EMITTING DEVICES AND MANUFACTURING METHODS THEREFOR

(71) Applicants: Beijing BOE Technology Development Co., Ltd., Beijing (CN); BOE Technology Group Co., Ltd., Beijing (CN)

(72) Inventors: Jingwen Feng, Beijing (CN); Zhuo Li, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 928 days.

(21) Appl. No.: 17/801,723

(22) PCT Filed: Sep. 24, 2021

(86) PCT No.: PCT/CN2021/120421

§ 371 (c)(1),
(2) Date: Aug. 23, 2022

(87) PCT Pub. No.: WO2023/044788

PCT Pub. Date: Mar. 30, 2023

(65) Prior Publication Data

US 2024/0237508 A1 Jul. 11, 2024

(51) Int. Cl.
*H10K 85/30* (2023.01)
*C09K 11/02* (2006.01)
(Continued)

(52) U.S. Cl.
CPC .......... *H10K 85/381* (2023.02); *C09K 11/025* (2013.01); *C09K 11/0883* (2013.01);
(Continued)

(58) Field of Classification Search
None
See application file for complete search history.

(56) References Cited

U.S. PATENT DOCUMENTS

| | | | |
|---|---|---|---|
| 2016/0233449 | A1 | 8/2016 | Murayama et al. |
| 2019/0203111 | A1 | 7/2019 | Mei |

(Continued)

FOREIGN PATENT DOCUMENTS

| | | | | |
|---|---|---|---|---|
| CN | 105684555 | A | | 6/2016 |
| CN | 108140734 | A | * | 6/2018 |

(Continued)

OTHER PUBLICATIONS

PCT/CN2021/120421 international search report.

*Primary Examiner* — Tae H Yoon
(74) *Attorney, Agent, or Firm* — IPro, PLLC

(57) ABSTRACT

The present application provides a quantum dot film layer, a quantum dot light emitting device and a manufacturing method therefor to improve the balance of carriers. The quantum dot film layer includes a first quantum dot layer and a second quantum dot layer. The first quantum dot layer includes first quantum dots, and first photosensitive ligands connected with surfaces of the first quantum dots. The second quantum dot layer includes second quantum dots, and second non-photosensitive ligands connected with surfaces of the second quantum dots. The second quantum dots are the same as the first quantum dots.

18 Claims, 4 Drawing Sheets

(51) Int. Cl.

| | |
|---|---|
| ***C09K 11/08*** | (2006.01) |
| ***C09K 11/70*** | (2006.01) |
| ***C09K 11/88*** | (2006.01) |
| ***H10K 50/115*** | (2023.01) |
| *B82Y 20/00* | (2011.01) |
| *B82Y 40/00* | (2011.01) |

(52) U.S. Cl.
CPC .......... *C09K 11/703* (2013.01); *C09K 11/883* (2013.01); *H10K 50/115* (2023.02); *B82Y 20/00* (2013.01); *B82Y 40/00* (2013.01)

(56) References Cited

U.S. PATENT DOCUMENTS

| | | | | |
|---|---|---|---|---|
| 2020/0332181 | A1 | 10/2020 | Zhang | |
| 2021/0242416 | A1 * | 8/2021 | Sumida ................ | C09K 11/881 |
| 2021/0388259 | A1 | 12/2021 | Mei et al. | |

FOREIGN PATENT DOCUMENTS

| | | | |
|---|---|---|---|
| CN | 108192591 | A | 6/2018 |
| CN | 109266350 | A | 1/2019 |
| CN | 110590549 | A | * 12/2019 |
| CN | 112018270 | A | 12/2020 |
| CN | 113088279 | A | 7/2021 |
| CN | 113285024 | A | 8/2021 |

* cited by examiner

QUANTUM DOT FILM LAYERS, QUANTUM DOT LIGHT EMITTING DEVICES AND MANUFACTURING METHODS THEREFOR

CROSS-REFERENCE TO RELATED APPLICATIONS

This application is a national stage of international PCT Application No. PCT/CN2021/120421 filed on Sep. 24, 2021, the entire contents of which are incorporated herein by reference.

TECHNICAL FIELD

The present application relates to the field of display technology, and in particular, to quantum dot film layers, quantum dot light emitting devices and manufacturing methods therefor.

BACKGROUND

Quantum dots (QDs) are zero-dimensional semiconductor nanomaterials that can be dispersed in water or organic solvents to form colloids. A size of a quantum dot is close to or even smaller than a Bohr radius of an exciton, i.e., an electron-hole pair, of semiconductor bulk counterparts, and electrons and holes generated when being excited are confined in narrow three-dimensional space, thereby exhibiting a quantum confinement effect and possessing unique optical properties.

Quantum Dot Light Emitting Diode Display (QLED) is a novel display technology developed on the basis of organic light emitting display. Their difference lies in that a light emitting layer in QLED is a quantum dot layer. A principle of QLED is: electrons/holes are injected into the quantum dot layer through electron/hole transport layer(s), and the electrons and the holes are combined to emit light in the quantum dot layer. Compared with Organic Light Emitting Diode Display (OLED), QLED has advantages of a narrow light emission peak, a high color saturation, a wide color gamut, etc.

There is room for further improving the balance of carriers in current QLED.

SUMMARY

According to a first aspect of embodiments of the present application, there is provided a quantum dot film layer, including: a first quantum dot layer and a second quantum dot layer, where

- the first quantum dot layer includes first quantum dots, and first photosensitive ligands connected with surfaces of the first quantum dots; and
- the second quantum dot layer includes second quantum dots, and second non-photosensitive ligands connected with surfaces of the second quantum dots, where the second quantum dots are the same as the first quantum dots.

In an embodiment, each of the first photosensitive ligands includes a non-photosensitive coordinating group and a photosensitive group, where an end of the coordinating group is connected with a surface of a corresponding first quantum dot, and other end of the coordinating group is connected with the photosensitive group;

- the coordinating groups are the same as the second non-photosensitive ligands.

In an embodiment, the coordinating groups and the second non-photosensitive ligands include any one of a sulfydryl group, a hydroxyl group, an amino group, a sulfonic acid group, a carboxyl group and a phosphoric acid group.

In an embodiment, the photosensitive groups have a structure shown in any one of formulas II-IV:

(II)

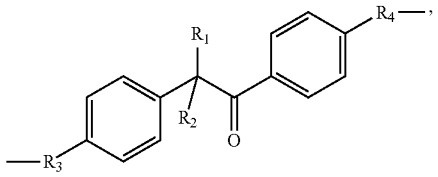

(III)

$$—R_5—N{=}N—R_6—, \quad \text{and}$$

(IV)

$$—R_7—O—O—R_8—,$$

where $R_1$ and $R_2$ to $R_8$ are selected from hydrogen, an alkoxy group, an alkyl group or an aromatic group.

In an embodiment, the first photosensitive ligands have a general structure shown in general formula I:

$$A—B, \qquad (I)$$

where A is a coordinating group, and B is a photosensitive group;

the coordinating group includes any one of a sulfydryl group, a hydroxyl group, an amino group, a sulfonic acid group, a carboxyl group and a phosphoric acid group;

the photosensitive group has a structure shown in any one of formulas II to IV:

(II)

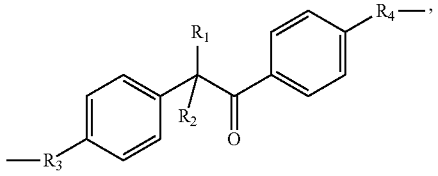

(III)

$$—R_5—N{=}N—R_6—, \quad \text{and}$$

(IV)

$$—R_7—O—O—R_8—,$$

where $R_1$ and $R_2$ to $R_8$ are selected from hydrogen, an alkoxy group, an alkyl group or an aromatic group.

In an embodiment, the first quantum dot layer further includes first alkyl chain ligands connected with the surfaces of the first quantum dots; and the second quantum dot layer further includes second alkyl chain ligands connected with the surfaces of the second quantum dots.

In an embodiment, the first alkyl chain ligands are the same as the second alkyl chain ligands.

In an embodiment, the first alkyl chain ligands and the second alkyl chain ligands include coordinating units and branched chain alkyl groups of $C_{15}$-$C_{50}$;

a number of carbon atoms in each branched chain of the branched chain alkyl groups is 6-12; and the coordinating units include any one of a sulfydryl group, a hydroxyl group, an amine group, an amino group, a carboxyl group, a phosphoric acid group, a phosphoester group and a sulfonic acid group.

According to a second aspect of the embodiments of the present application, there is provided a quantum dot light emitting device, including: a hole transport layer, an electron transport layer, and the quantum dot film layer located between the hole transport layer and the electron transport layer as described above.

In an embodiment, in an electron-excessive system, the second quantum dot layer is disposed on a side of the first quantum dot layer away from the electron transport layer.

In an embodiment, in a hole-excessive system, the second quantum dot layer is disposed on a side of the first quantum dot layer away from the hole transport layer.

According to a third aspect of the embodiments of the present application, there is provided a manufacturing method of a quantum dot light emitting device, including:

forming the quantum dot film layer as described above on a substrate.

In an embodiment, forming the quantum dot film layer includes:

forming a second quantum dot pre-laver on the substrate, where the second quantum dot pre-layer includes the second quantum dots, and second photosensitive ligands connected with the surfaces of the second quantum dots;

exposing the second quantum dot pre-layer to light irradiation, so that the second photosensitive ligands therein undergo a cleavage reaction to transform the second quantum dot pre-layer into the second quantum dot layer; and forming the first quantum dot layer on the second quantum dot layer.

In an embodiment, forming the quantum dot film layer includes:

forming the first quantum dot layer on the substrate;

forming a second quantum dot pre-layer on the first quantum dot layer, where the second quantum dot pre-layer includes the second quantum dots, and second photosensitive ligands connected with the surfaces of the second quantum dots; and exposing the second quantum dot pre-layer to light irradiation, so that the second photosensitive ligands therein undergo a cleavage reaction to transform the second quantum dot pre-laver into the second quantum dot layer.

In an embodiment, the first quantum dot layer and the second quantum dot pre-layer are made of a same material; and the first quantum dot layer and the second quantum dot pre-layer are formed in one step.

DETAILED DESCRIPTION OF THE EMBODIMENTS

Figure 1:
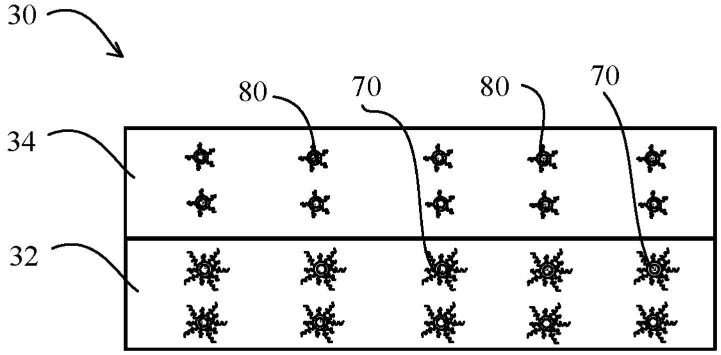
FIG. 1 is a schematic structural diagram illustrating a quantum dot film layer according to an exemplary embodiment of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of apparatuses and methods consistent with some aspects of the present application as detailed in the appended claims.

The terms used in the present application are for the purpose of describing particular examples only, and are not intended to limit the present application. Terms determined by “a”, “the” and “said” in their singular forms in the present application and the appended claims are also intended to include plurality, unless clearly indicated otherwise in the context. It should also be understood that the term “and/or” as used herein refers to and includes any and all possible combinations of one or more of the associated listed items.

It is to be understood that, although terms “first,” “second,” “third,” and the like may be used in the present application to describe various information, such information should not be limited to these terms. These terms are only used to distinguish one category of information from another. For example, without departing from the scope of the present application, a first film layer may be referred as a second film layer; and similarly, the second film layer may also be referred as the first film layer. Depending on the context, the word “if” as used herein may be interpreted as “when” or “upon” or “in response to determining”.

Quantum dot film layers, quantum dot light emitting devices and manufacturing methods therefor in the embodiments of the present application will be described in detail below with reference to the accompanying drawings. In a case of no conflict, features in the following embodiments can be supplemented or combined with each other.

An embodiment of the present application discloses a quantum dot film layer 30. As shown in FIG. 1, the quantum dot film layer 30 includes a first quantum dot layer 32 and a second quantum dot layer 34 which are laminated. The first quantum dot layer 32 may include a plurality of first quantum particles 70, and the second quantum dot layer 34 may include a plurality of second quantum particles 80.

Figure 2:
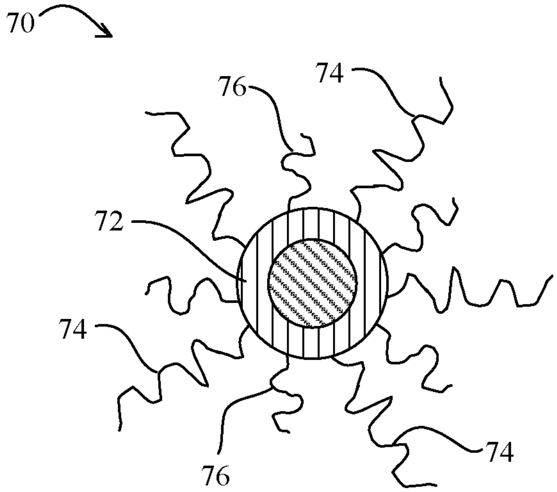
FIGS. 2 and 3 are schematic structural diagrams illustrating a first quantum dot particle and a second quantum dot particle in FIG. 1 respectively.

With reference to FIG. 2, each of the first quantum particles 70 in the first quantum dot layer 32 may include a first quantum dot 72, and first photosensitive ligands 74 connected with a surface of the first quantum dot 72. In an embodiment, the first quantum dot 72 may have a core-shell structure. The first photosensitive ligands 74 may be ligands sensitive to ultraviolet light. The first photosensitive ligands 74, when being exposed to ultraviolet light irradiation, undergo a cleavage reaction, so that a part of a first photosensitive ligand 74 peels off the surface of the first quantum dot 72. Before the film layer is formed, the first quantum particles 70 exist in a state of solution. The long-chain first photosensitive ligands 74 can ensure the stability of the solution and prevent the first quantum particles 70 from settling/precipitating. Although the first quantum dot layer 32 is a film layer formed by using the first photosensitive ligands 74, the first quantum dot layer 32 has not been directly exposed to ultraviolet light irradiation, so that the first photosensitive ligands 74 in the first quantum dot layer 32 have not undergone the cleavage reaction.

In some embodiments, the first photosensitive ligands 74 include non-photosensitive coordinating groups and photosensitive groups, and have a structure shown in general formula I:

$$A—B, \quad (I)$$

where A is a coordinating group, and B is a photosensitive group;

the coordinating group includes any one of a sulfydryl group, a hydroxyl group, an amino group, a sulfonic acid group, a carboxyl group and a phosphoric acid group;

the photosensitive group has a structure shown in any one of formulas II to IV:

(II)

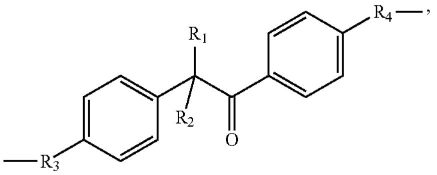

$$—R_5—N{=}N—R_6—, \quad \text{and} \quad (III)$$

$$—R_7—O—O—R_8—, \quad (IV)$$

where $R_1$ and $R_2$ to $R_8$ are selected from hydrogen, an alkoxy group, an alkyl group or an aromatic group.

In the above embodiments, the coordinating groups are used to form connections with the first quantum dot, and the photosensitive groups can be cleaved through ultraviolet light irradiation. The coordinating groups are insensitive to light. Thus, even if the coordinating groups are exposed to light irradiation, their previous structures are still maintained. The coordinating groups and the photosensitive groups are connected by chemical bonds, and their specific connection means is not limited in this application.

Further, each of the first quantum particles 70 in the first quantum dot layer 32 may further include first alkyl chain ligands 76 connected with the surface of the first quantum dot 72. The first alkyl chain ligands 76 can passivate surface defects of the quantum dots, and can improve the solubility of the quantum dots in organic solvents.

In some embodiments, the first alkyl chain ligands 76 include coordinating units and branched chain alkyl groups of $C_{15}$-$C_{50}$. A number of carbon atoms in each branched chain of the branched chain alkyl groups is 6 to 12.

In the first alkyl chain ligands 76, the coordinating units include any one of a sulfydryl group, a hydroxyl group, an amine group, an amino group, a carboxyl group, a phosphoric acid group, a phosphoester group and a sulfonic acid group. The coordinating units are located between the first quantum dot 72 and the branched chain alkyl groups for forming connections with the surface of the first quantum dot 72, so as to connect the branched chain alkyl groups and the first quantum dot 72. The first alkyl chain ligands 76 can increase the solubility of the quantum dots in organic solvents, so as to facilitate the formation of a mixed solution containing the quantum dots for coating to form a quantum dot film.

The first alkyl chain ligands 76 can be:

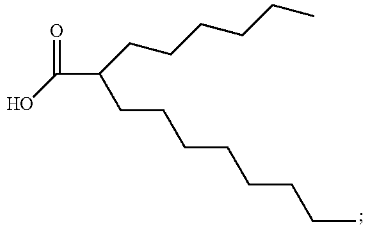

; or

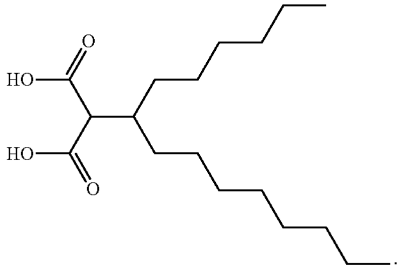

.

The first alkyl chain ligands 76 connected with the surface of the first quantum dot 72 may be the same, or alternatively be of different types. The first photosensitive ligands 74 connected with the surface of the first quantum dot 72 may be the same, or alternatively be of different types. In addition, amounts of the first alkyl chain ligands 76 and the first photosensitive ligands 74 can be flexibly adjusted during the synthesis of quantum dot particles.

Figure 3:
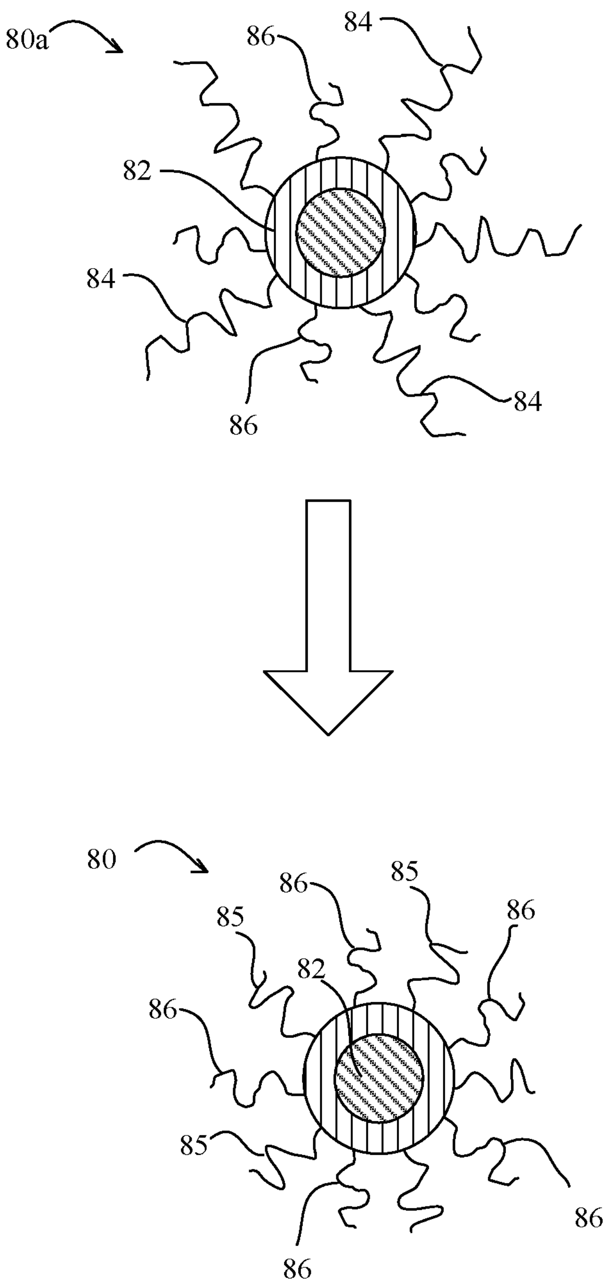

With reference to FIG. 3, each of second quantum particles 80 in the second quantum dot layer 34 includes a second quantum dot 82, and second non-photosensitive ligands 85 connected with a surface of the second quantum dot 82. A total amount of ligands connected with the surfaces of the second quantum dots 82 in the second quantum dot layer 34 is smaller than that of ligands connected with the surfaces of the first quantum dots 72 in the first quantum dot layer 32. The amount mentioned here includes both a number of ligands contained in a unit volume and a length of ligands. Both the number and the length of ligands can affect the transport efficiency of carriers in a corresponding film layer. When ligands are same, the amount of ligands can be decreased by reducing the number of ligands; when the number of ligands is equal, the amount of ligands can be decreased by shortening the length (chain length) of ligands. The above arrangement makes the transport efficiency of carriers in the second quantum dot layer 34 higher than that in the first quantum dot layer 32.

The second quantum dot layer 34 may be formed by exposing the second quantum dots 82 and the second photosensitive ligands 84 connected with the surfaces of the second quantum dots 82 to light irradiation.

Figure 4:
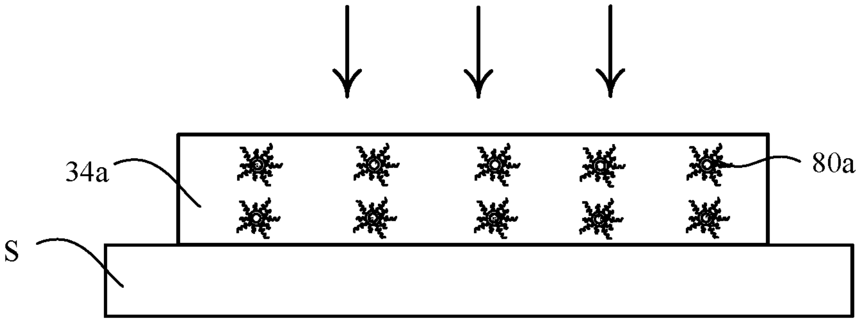
FIGS. 4 to 6 are schematic diagrams illustrating methods of manufacturing a quantum dot light emitting device according to exemplary embodiments of the present application.

In an embodiment, the second quantum dot layer 34 can be formed by the following steps:

At S12, a second quantum dot pre-layer 34*a* is formed. As shown in FIG. 4, the second quantum dot pre-layer 34*a* includes a plurality of second quantum particles 80*a*.

As shown in FIG. 3, each of the second quantum particles 80*a* in the second quantum dot pre-layer 34*a* may include a second quantum dot 82, and second photosensitive ligands

84 connected with a surface of the second quantum dot 82. In an embodiment, the second quantum dot 82 may have a core-shell structure. The second photosensitive ligands 84 may be ligands sensitive to ultraviolet light. The second photosensitive ligands 84, when being exposed to ultraviolet light irradiation, may undergo a cleavage reaction, so that a part of a second photosensitive ligand 84 peels off the surface of the second quantum dot 82. Before the film layer is formed, the second quantum particles 80*a* exist in a state of solution. The long-chain second photosensitive ligands 84 can ensure the stability of the solution and prevent the second quantum particles 80*a* from settling.

In some embodiments, the second photosensitive ligands 84 include non-photosensitive coordinating groups and photosensitive groups, and have a structure shown in general formula I:

$$A—B, \quad (I)$$

where A is a coordinating group, and B is a photosensitive group;

the coordinating group includes any one of a sulfydryl group, a hydroxyl group, an amino group, a sulfonic acid group, a carboxyl group and a phosphoric acid group;

the photosensitive group has a structure shown in any one of formulas II to IV:

(II)

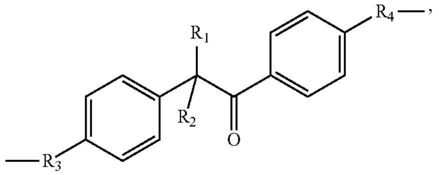

$$—R_5—N{=}N—R_6—, \quad (III)$$

and $$—R_7—O—O—R_8—, \quad (IV)$$

where $R_1$ and $R_2$ to $R_8$ are selected from hydrogen, an alkoxy group, an alkyl group or an aromatic group.

In the above embodiments, the coordinating groups are used to form connections with the second quantum dot, and the photosensitive groups can be cleaved through ultraviolet light irradiation. The coordinating groups are insensitive to light. Thus, even if the coordinating groups are exposed to light irradiation, their previous structures are still maintained. The coordinating groups and the photosensitive groups are connected by chemical bonds, and their specific connection means is not limited in this application.

Further, each of the second quantum particles 80*a* in the second quantum dot pre-layer 34*a* may further include second alkyl chain ligands 86 connected with the surface of the second quantum dot 82. The second alkyl chain ligands 86 can passivate surface defects of the quantum dots, and can improve the solubility of the quantum dots in organic solvents.

In some embodiments, the second alkyl chain ligands 86 include coordinating units and branched chain alkyl groups of $C_{15}$-$C_{50}$. A number of carbon atoms in each branched chain of the branched chain alkyl groups is 6 to 12.

In the second alkyl chain ligands 86, the coordinating units include any one of a sulfydryl group, a hydroxyl group, an amine group, an amino group, a carboxyl group, a phosphoric acid group, a phosphoester group and a sulfonic acid group. The coordinating units are located between the second quantum dot 82 and the branched chain alkyl groups for forming connections with the surface of the second quantum dot 82, so as to connect the branched chain alkyl groups and the second quantum dot 82. The second alkyl chain ligands 86 can increase the solubility of the quantum dots in organic solvents, so as to facilitate the formation of a mixed solution containing the quantum dots for coating to form a quantum dot film.

The second alkyl chain ligands 86 can be:

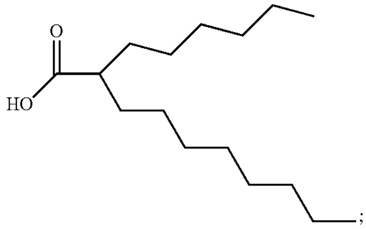

; or

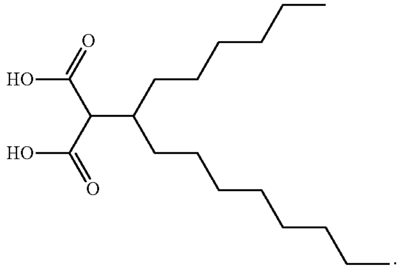

.

The second alkyl chain ligands 86 connected with the surface of the second quantum dot 82 may be the same or alternatively be of different types. The second photosensitive ligands 84 connected with the surface of the second quantum dot 82 may be the same or alternatively be of different types. In addition, amounts of the second alkyl chain ligands 86 and the second photosensitive ligands 84 can be flexibly adjusted during the synthesis of quantum dot particles. The higher the amount of the second photosensitive ligands 84 is, the more the ligands cleaved after light irradiation is, and the better the transport performance of carriers is.

Figure 5:
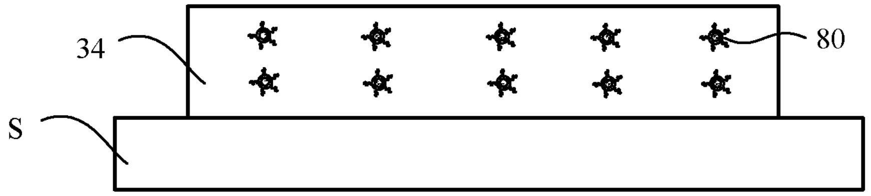

At S14, the second quantum dot pre-layer 34*a* is exposed to light irradiation. Referring to FIG. 4 and FIG. 5, the second photosensitive ligands 84 undergo a cleavage reaction, so that a part (i.e., photosensitive groups) of the second photosensitive ligands 84 peel off the surface of the second quantum dot 82, and other part (i.e., non-photosensitive coordinating groups) of the second photosensitive ligands 84 remain connected with the surface of the second quantum dot 82, and become the second non-photosensitive ligands 85. Correspondingly, the second quantum particles 80*a* are transformed into the second quantum particles 80, and the second quantum dot pre-layer 34*a* is transformed into the second quantum dot layer 34.

During application of quantum dots with a high amount of ligands to electroluminescent devices, the high amount of ligands (including photosensitive ligands and alkyl chain ligands) may hinder the injection of carriers and affect the electroluminescence performance of the devices. The peeling of the second photosensitive ligands 84 can significantly decrease the amount of ligands and improve the injection efficiency of carriers. Therefore, the injection or transport efficiency of carriers in the second quantum dot layer 34 is significantly higher than that in the first quantum dot layer 32.

The use of the quantum dot film layer 30 having the first quantum dot layer 32 and the second quantum dot layer 34 can adjust and improve the carrier balance of electroluminescence devices. For example, in an electron-excessive system, the quantum dot film layer 30 can be used as an organic light emitting material layer, and the second quantum dot layer 34 is provided far away from an electron transport layer and close to a hole transport layer, while the first quantum dot layer 32 is provided close to the electron transport layer and far away from the hole transport layer. The above structure is favorable for the injection of holes but unfavorable for the injection of electrons, so that the carrier balance of the electron system-excessive can be adjusted.

For another example, in a hole-excessive system, the quantum dot film layer 30 can be used as an organic light emitting material layer, and the second quantum dot layer 34 is provided far away from a hole transport layer and close to an electron transport layer, while the first quantum dot layer 32 is provided close to the hole transport layer and far away from the electron transport layer. The above structure is favorable for the injection of electrons but unfavorable for the injection of holes, so that the carrier balance of the hole-excessive system can be adjusted.

In some embodiments, the first quantum dot layer 32 and the second quantum dot layer 34 are made of the same raw material, and their difference lies only in that the first quantum dot layer 32 is produced without light irradiation, but the second quantum dot layer 34 is produced with light irradiation. The two quantum dot layers have the same organic solvent, quantum dots, ligands, etc., which is beneficial to improve the production speed and save the production cost. For example, after a solution containing quantum dot particles is prepared, a part of the solution is used to make the first quantum dot layer 32, and the other part of the solution is used to make the second quantum dot layer 34.

In the above embodiments, the preparation of quantum dot particles (for example, the first quantum particles 70 and the second quantum particles 80*a*) is involved. Theoretically, various existing methods can be adopted for the preparation. Quantum dots with two or more types of ligands (at least one of which is a photosensitive ligand) can be synthesized through ligand exchange technology. That is, quantum dots with common alkyl chain ligands are first prepared by a conventional quantum dot synthesis method, and then the alkyl chain ligands are partially replaced with photosensitive ligands through ligand exchange to obtain quantum dots with two or more types of ligands (at least one of which is a photosensitive ligand).

The quantum dot particles used in this application include, but are not limited to, CdS/ZnSZnS, CdSe/ZnS, InP/ZnS, PbS/ZnS, $CsPbCl_3$/ZnS, $CsPbBr_3$/ZnS, $CsPbI_3$/ZnS, CdS/ZnS, ZnTe/ZnSe/ZnS, and ZnSeTe/ZnSe/ZnS quantum dots.

The quantum dot ligands in this application are usually long-chain alkane ligands, including, but not limited to, trioctylphosphine, tributylphosphine, oleic acid, stearic acid, oleylamine, long-chain alkylamine, long-chain alkylphosphine, long-chain alkyl phosphonic acids.

The photosensitive ligands are ligands with photosensitive groups in their inner sections, and the small molecules, that is, the photosensitive ligands, after being exposed to ultraviolet light irradiation, undergo bond cleavage. The photosensitive groups include carbonyl groups or double bonds.

In some embodiments, a method of preparing quantum dot particles is as follows.

First, quantum dots with long-chain ligands were prepared by a conventional quantum dot synthesis method. Taking InP/ZnS as an example, in a glove box vacuum environment, 120.54 mg of indium bromide (InBr3) and 495.40 mg of zinc bromide (ZnBr2) were weighed with an electronic balance and added to a 50 ml three-necked flask. 5 ml of oleylamine (OLA) was added to the three-necked flask; the flask was vacuumed for 30 min and heated to 100° C. until there was no water vapor in the flask, and thereafter, argon gas (Ar) was introduced into the flask. A temperature of the flask was raised to 215° C.; and a mixed solution with 0.45 ml of tris(dimethylamino)phosphine [(DMA)3P] and 1.0 ml of oleylamine (OLA) was injected into the flask; the flask was kept at 215° C. for 20 min. The mixture was stirred at an appropriate speed so as to allow the mixture to fully react; 1.5 ml of dodecanethiol and 6 ml of stearic acid-ODE solution (15 g of zinc stearate was dissolved in 60 ml of ODE) was quickly added with a syringe. Next, a thermometer was set to 300° C., and samples of the mixture were taken from the reactor at 10 min, 20 min, 30 min, and 40 min respectively; after the reaction was conducted for 40 min, heating to the reactor was stopped. After the solution was cooled to 70° C. to 80° C., a certain amount of n-hexane was added to the solution; the mixture was centrifuged at 10,000 rpm (revolutions per minute) to make zinc stearate precipitate; a certain amount of n-hexane and anhydrous ethanol were added to the solution; the mixture was centrifuged at 10,000 rpm to make InP/ZnS nanocrystals precipitate, and the precipitate was dried with $N_2$. The obtained InP/ZnS nanocrystals could be well dissolved in n-hexane solution; and then characterized and analyzed. During the reaction, the solution changes from colorless transparence to brown, and then gradually changes to yellow green.

Subsequently, quantum dots with two or more types of ligands (including at least common alkyl chains and photosensitive ligands) were prepared by exchanging ligands in a solution.

Taking CdSe/ZnS quantum dots with oleic acid ligands as an example, a method of transforming them into quantum dots with two or more types of ligands (at least one of which is a photosensitive ligand) by replacement is as follows:

CdSe/ZnS quantum dots with long-chain oleic acid ligands prepared by a conventional method were centrifugally washed with ethanol. After a supernatant was removed, the quantum dots were re-dispersed in octane (n-heptane and n-hexane could also be used). Photosensitive ligands dissolved in ethanol (or other alcohols) were added to a quantum dot colloid, and the mixture was stirred at 80° C. for 1 h, so that ligands can be exchanged.

In the above steps, the purpose of centrifugal washing is to remove by-products or impurities that do not react completely during the synthesis of quantum dots, and enable quantum dots with inconsistent sizes to be separated in this process, which results in that the quantum dots are purer, their sizes are more uniform, and their subsequent performance in the devices is better.

A structure formula of the oleic acid used in the above embodiments can be: $CH_3(CH_2)_7CH{=}CH(CH_2)_7COOH$, and can also be expressed as:

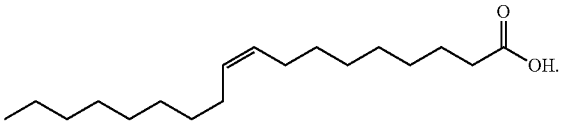 [SMILES: CCCCCCCC/C=C\CCCCCCCC(=O)O]

Chinese patent document CN108192591A discloses a method of preparing quantum dot particles with two or more types of ligands by ligand exchange, which can also be applied in this application.

An embodiment of the present application further provides a method of manufacturing a quantum dot light emitting device, which can be used to manufacture the above-described quantum dot light emitting device. The manufacturing method may include the following.

A quantum dot film layer as described above is formed on a substrate.

In some embodiments, the step of forming the quantum dot film layer includes:

As shown in FIG. 4, a second quantum dot pre-layer **34*a* is formed on a substrate S, and the second quantum dot pre-layer 34*a*** includes second quantum dots, and second photosensitive ligands connected with surfaces of the second quantum dots.

As shown in FIG. 5, the second quantum dot pre-layer **34*a* is exposed to light irradiation, so that the second photosensitive ligands therein undergo a cleavage reaction to transform the second quantum dot pre-layer into a second quantum dot layer 34**.

Figure 6:
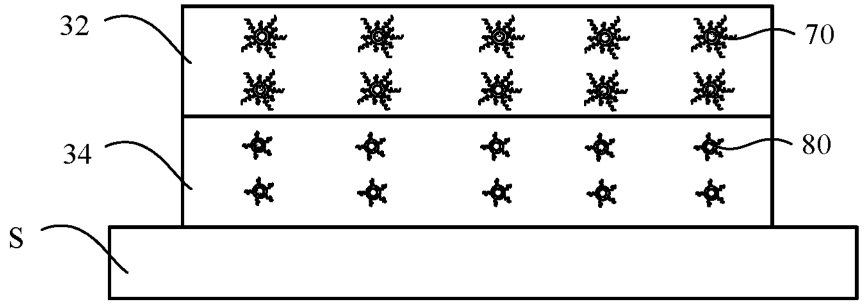

As shown in FIG. 6, a first quantum dot layer 32 is formed on the second quantum dot layer 34.

In the above embodiments, the formed first quantum dot layer 32 may dissolve a partial thickness of the lower second quantum dot layer 34. For this reason, when forming the second quantum dot layer 34, a certain extra thickness can be formed. In this way, even after the extra thickness of the second quantum dot layer 34 is dissolved, a remaining thickness of the second quantum dot layer 34 is sufficient for use.

Figure 7:
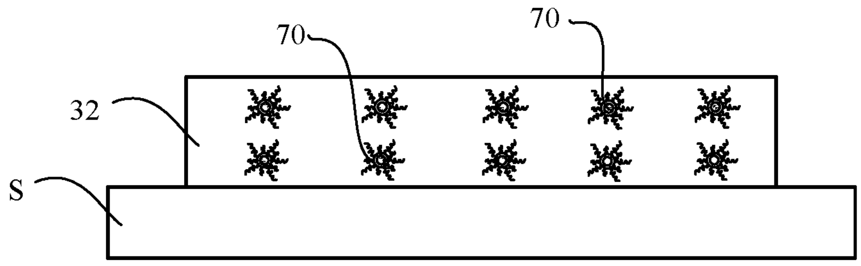
FIGS. 7 to 9 are schematic diagrams illustrating methods of manufacturing a quantum dot light emitting device according to exemplary embodiments of the present application.

In some embodiments, the step of forming the quantum dot film layer includes:

As shown in FIG. 7, a first quantum dot layer 32 is formed on a substrate S.

Figure 8:
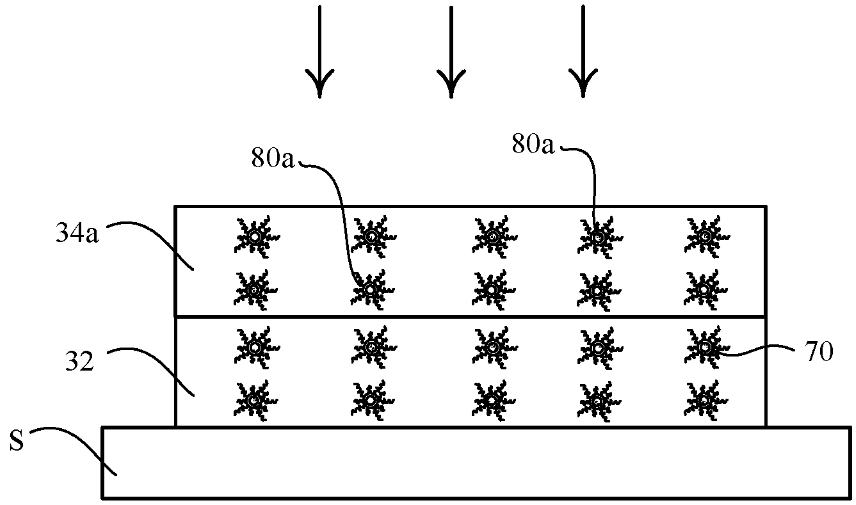

As shown in FIG. 8, a second quantum dot pre-layer **34*a* is formed on the first quantum dot layer 32, and the second quantum dot pre-layer 34*a*** includes second quantum dots, and second photosensitive ligands connected with surfaces of the second quantum dots.

Figure 9:
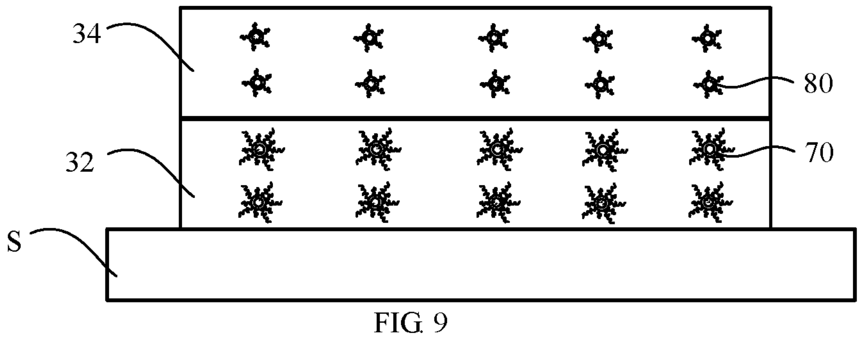

As shown in FIG. 9, the second quantum dot pre-layer **34*a* is exposed to light irradiation, so that the second photosensitive ligands therein undergo a cleavage reaction to transform the second quantum dot pre-layer 34*a* into a second quantum dot layer 34**.

In the above embodiments, by controlling a depth of light irradiation, light can be made to reach and irradiate only the upper second quantum dot pre-layer **34*a*, but not to irradiate the lower first quantum dot layer 32, so as to avoid first quantum particles 70 in the first quantum dot layer 32** from undergoing a cleavage reaction.

In the above embodiments, the formed second quantum dot layer 34 may dissolve a partial thickness of the lower first quantum dot layer 32. For this reason, when the first quantum dot layer 32 is formed, a certain extra thickness can be formed. In this way, even after the extra thickness of the first quantum dot layer 32 is dissolved, a remaining thickness of the first quantum dot layer 32 is sufficient for use.

In the above embodiments, the first quantum dot layer 32 and the second quantum dot pre-layer **34*a*** can be made of the same material. Correspondingly, the first quantum dot layer and the second quantum dot pre-layer can be formed in one step. For example, a sufficiently thick quantum dot material layer is firstly formed on the substrate S by spin coating, printing or ink jetting; then, the quantum dot material layer is exposed to light irradiation, and a penetration depth of the light irradiation is precisely controlled during the irradiation, so that only a partial thickness of the quantum dot material layer is exposed to light irradiation. The part of the quantum dot material layer that is exposed to light irradiation undergoes a reaction to form the second quantum dot layer, and a remaining part of the quantum dot material layer that is not exposed to light irradiation serves as the first quantum dot layer.

The formed quantum dot light emitting device may have either an upright structure or an inverted structure.

In the upright structure, the quantum dot light emitting device may include: an anode located on a substrate; a hole transport layer located on the anode; the quantum dot film layer described above located on the hole transport layer; an electron transport layer located on the quantum dot film layer; and a cathode located on the electron transport layer.

In the inverted structure, the quantum dot light emitting device may include: a cathode located on a substrate; an electron transport layer located on the cathode; the quantum dot film layer described above located on the electron transport layer; a hole transport layer located on the quantum dot film layer; and an anode located on the hole transport layer.

In the above embodiments, a hole injection layer may be provided between the hole transport layer and the anode. The hole transport layer, the hole injection layer, the electron transport layer and the quantum dot film layer can be formed by spin coating, printing or ink jetting.

It should be pointed out that, in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

Other embodiments of the present application will be readily apparent to those skilled in the art after considering the specification and practicing the contents disclosed herein. The present application is intended to cover any variations, uses, or adaptations of the present application, which follow the general principle of the present application and include common knowledge or conventional technical means in the art that are not disclosed in the present application. The specification and examples are to be regarded as illustrative only. The true scope and spirit of the present application are pointed out by the following claims.

It is to be understood that the present application is not limited to the precise structures that have described and shown in the drawings, and various modifications and changes can be made without departing from the scope thereof. The scope of the application is to be limited only by the appended claims.

The invention claimed is:

1. A quantum dot film layer, comprising:

a first quantum dot layer and a second quantum dot layer which are laminated, wherein the first quantum dot layer comprises first quantum dots, first photosensitive ligands connected with surfaces of the first quantum dots, and first alkyl chain ligands connected with the surfaces of the first quantum dots; and the second quantum dot layer comprises second quantum dots, second non-photosensitive ligands connected with surfaces of the second quantum dots, and second alkyl chain ligands connected with the surfaces of the second quantum dots, wherein the second quantum dots are the same as the first quantum dots.

2. The quantum dot film layer according to claim 1, wherein each of the first photosensitive ligands comprises a non-photosensitive coordinating group and a photosensitive group, wherein an end of the coordinating group is connected with a surface of a corresponding first quantum dot, and other end of the coordinating group is connected with the photosensitive group;

the coordinating groups are the same as the second non-photosensitive ligands.

3. The quantum dot film layer according to claim 2, wherein the coordinating groups and the second non-photosensitive ligands comprise any one of a sulfydryl group, a hydroxyl group, an amino group, a sulfonic acid group, a carboxyl group and a phosphoric acid group.

4. The quantum dot film layer according to claim 2, wherein the photosensitive groups have a structure shown in any one of formulas II-IV:

(II)

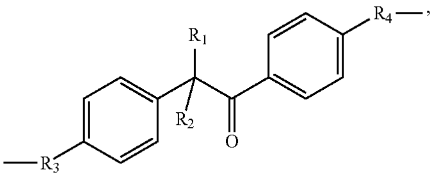

(III)

$$-R_5-N=N-R_6-,$$ and (IV)

$$-R_7-O-O-R_8-,$$

wherein $R_1$ and $R_2$ to $R_8$ are selected from hydrogen, an alkoxy group, an alkyl group or an aromatic group.

5. The quantum dot film layer according to claim 1, wherein the first photosensitive ligands have a general structure shown in general formula I:

(I)

$$A-B,$$

wherein A is a coordinating group, and B is a photosensitive group;

the coordinating group comprises any one of a sulfydryl group, a hydroxyl group, an amino group, a sulfonic acid group, a carboxyl group and a phosphoric acid group;

the photosensitive group has a structure shown in any one of formulas II to IV:

(II)

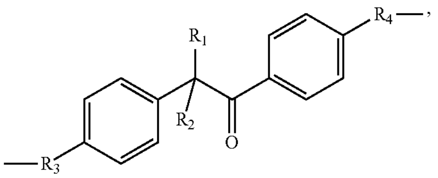

(III)

$$-R_5-N=N-R_6-,$$ and (IV)

$$-R_7-O-O-R_8-,$$

wherein $R_1$ and $R_2$ to $R_8$ are selected from hydrogen, an alkoxy group, an alkyl group or an aromatic group.

6. The quantum dot film layer according to claim 1, wherein the first alkyl chain ligands are the same as the second alkyl chain ligands.

7. The quantum dot film layer according to claim 1, wherein the first alkyl chain ligands and the second alkyl chain ligands comprise coordinating units and branched chain alkyl groups of $C_{15}$-$C_{50}$;

a number of carbon atoms in each branched chain of the branched chain alkyl groups is 6-12; and the coordinating units comprise any one of a sulfydryl group, a hydroxyl group, an amine group, an amino group, a carboxyl group, a phosphoric acid group, a phosphoester group and a sulfonic acid group.

8. A quantum dot light emitting device, comprising: a hole transport layer, an electron transport layer, and a quantum dot film layer located between the hole transport layer and the electron transport layer, and the quantum dot film layer comprises a first quantum dot layer and a second quantum dot layer which are laminated, wherein the first quantum dot layer comprises first quantum dots, first photosensitive ligands connected with surfaces of the first quantum dots, and first alkyl chain ligands connected with the surfaces of the first quantum dots; and the second quantum dot layer comprises second quantum dots, second non-photosensitive ligands connected with surfaces of the second quantum dots, and second alkyl chain ligands connected with the surfaces of the second quantum dots, wherein the second quantum dots are the same as the first quantum dots.

9. The quantum dot light emitting device according to claim 8, wherein, in an electron-excessive system, the second quantum dot layer is disposed on a side of the first quantum dot layer away from the electron transport layer.

10. The quantum dot light emitting device according to claim 8, wherein, in a hole-excessive system, the second quantum dot layer is disposed on a side of the first quantum dot layer away from the hole transport layer.

11. A manufacturing method of a quantum dot light emitting device, comprising:

forming a quantum dot film layer on a substrate, and the quantum dot film layer comprises a first quantum dot layer and a second quantum dot layer which are laminated, wherein the first quantum dot layer comprises first quantum dots, first photosensitive ligands connected with surfaces of the first quantum dots, and first alkyl chain ligands connected with the surfaces of the first quantum dots; and the second quantum dot layer comprises second quantum dots, second non-photosensitive ligands connected with surfaces of the second quantum dots, and second alkyl chain ligands connected with the surfaces of the second quantum dots, wherein the second quantum dots are the same as the first quantum dots.

12. The manufacturing method according to claim 11, wherein forming the quantum dot film layer comprises:

forming a second quantum dot pre-layer on the substrate, wherein the second quantum dot pre-layer comprises the second quantum dots, and second photosensitive ligands connected with the surfaces of the second quantum dots;

exposing the second quantum dot pre-layer to light irradiation, so that the second photosensitive ligands therein undergo a cleavage reaction to transform the second quantum dot pre-layer into the second quantum dot layer; and forming the first quantum dot layer on the second quantum dot layer.

13. The manufacturing method according to claim 11, wherein forming the quantum dot film layer comprises:

forming the first quantum dot layer on the substrate;

forming a second quantum dot pre-layer on the first quantum dot layer, wherein the second quantum dot pre-layer comprises the second quantum dots, and second photosensitive ligands connected with the surfaces of the second quantum dots; and exposing the second quantum dot pre-layer to light irradiation, so that the second photosensitive ligands therein undergo a cleavage reaction to transform the second quantum dot pre-layer into the second quantum dot layer.

14. The manufacturing method according to claim 13, wherein the first quantum dot layer and the second quantum dot pre-layer are made of a same material; and the first quantum dot layer and the second quantum dot pre-layer are formed in one step.

15. The quantum dot light emitting device according to claim 8, wherein each of the first photosensitive ligands comprises a non-photosensitive coordinating group and a photosensitive group, wherein an end of the coordinating group is connected with a surface of a corresponding first quantum dot, and other end of the coordinating group is connected with the photosensitive group;

the coordinating groups are the same as the second non-photosensitive ligands.

16. The quantum dot light emitting device according to claim 15, wherein the coordinating groups and the second non-photosensitive ligands comprise any one of a sulfydryl group, a hydroxyl group, an amino group, a sulfonic acid group, a carboxyl group and a phosphoric acid group.

17. The quantum dot light emitting device according to claim 15, wherein the photosensitive groups have a structure shown in any one of formulas II-IV:

(II)

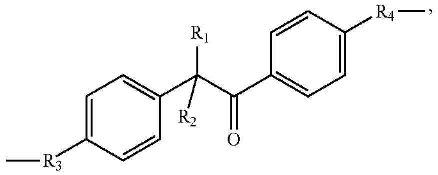

(III)

$$—R_5—N{=}N—R_6—,\quad \text{and}$$

(IV)

$$—R_7—O—O—R_8—,$$

wherein $R_1$ and $R_2$ to $R_8$ are selected from hydrogen, an alkoxy group, an alkyl group or an aromatic group.

18. The quantum dot light emitting device according to claim 8, wherein the first photosensitive ligands have a general structure shown in general formula I:

$$A—B, \quad (I)$$

wherein A is a coordinating group, and B is a photosensitive group;

the coordinating group comprises any one of a sulfydryl group, a hydroxyl group, an amino group, a sulfonic acid group, a carboxyl group and a phosphoric acid group;

the photosensitive group has a structure shown in any one of formulas II to IV:

(II)

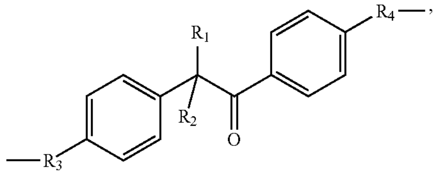

(III)

$$—R_5—N{=}N—R_6—,\quad \text{and}$$

(IV)

$$—R_7—O—O—R_8—,$$

wherein $R_1$ and $R_2$ to $R_8$ are selected from hydrogen, an alkoxy group, an alkyl group or an aromatic group.

* * * * *